(12) United States Patent
McClure

(10) Patent No.: US 7,208,987 B2
(45) Date of Patent: Apr. 24, 2007

(54) RESET INITIALIZATION

(75) Inventor: David Charles McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 159 days.

(21) Appl. No.: 10/999,751

(22) Filed: Nov. 30, 2004

(65) Prior Publication Data

US 2005/0134345 A1   Jun. 23, 2005

Related U.S. Application Data

(60) Provisional application No. 60/530,726, filed on Dec. 18, 2003.

(51) Int. Cl.
*H03L 7/00* (2006.01)

(52) U.S. Cl. .................................. 327/143

(58) Field of Classification Search ............ 327/142, 327/143, 198
See application file for complete search history.

(56) References Cited

U.S. PATENT DOCUMENTS

| | | | | | |
|---|---|---|---|---|---|
| 5,477,176 | A | * | 12/1995 | Chang et al. | 327/143 |
| 5,485,111 | A | * | 1/1996 | Tanimoto | 327/143 |
| 5,519,347 | A | * | 5/1996 | Kim | 327/143 |
| 5,686,847 | A | * | 11/1997 | Stubbe et al. | 327/143 |
| 5,825,220 | A | * | 10/1998 | Kinugasa et al. | 327/143 |
| 5,831,460 | A | * | 11/1998 | Zhou | 327/143 |
| 5,864,247 | A | * | 1/1999 | Hirano et al. | 327/143 |
| 5,912,571 | A | * | 6/1999 | Li et al. | 327/143 |
| 6,104,221 | A | * | 8/2000 | Hoon | 327/143 |
| 6,252,442 | B1 | * | 6/2001 | Malherbe | 327/143 |

* cited by examiner

*Primary Examiner*—Jeffrey Zweizig
(74) *Attorney, Agent, or Firm*—Lisa K. Jorgenson; Renee Michelle Leveque

(57) ABSTRACT

A reset initialization structure and method is described. A power on reset pulse is utilized to force the state of system reset during intervals of Vcc which otherwise would result in indeterminate reset states. Operation is adaptable to include all DC power systems. The reset initialization structure provides operational protection during power up and power down conditions.

11 Claims, 6 Drawing Sheets

RESET INITIALIZATION

PRIORITY CLAIM

This application claims priority from the provisional U.S. patent application titled "RESET INITIALIZATION", filed Dec. 18, 2003 and identified by Ser. No. 60/530,726, which is hereby incorporated herein by reference.

BACKGROUND

Reset circuits are used to monitor power supplies in microprocessors, digital equipment, and various other electronic equipment and systems. A reset circuit is used to assert a reset signal whenever the supply voltage falls below a determined threshold voltage and to de-assert said reset signal when the supply voltage rises above the threshold. This reset signal may be input to the microprocessor, for example, to start the microprocessor in a known state during power up to prevent code execution errors, during power down to initiate a clean shutdown sequence, and during brownout to achieve control over marginal voltage conditions.

One common deficiency of reset circuits is that proper assertion of reset signals during power up and power down conditions does not reliably occur. As voltages become low during power down, reset may be asserted intermittently due to reset circuitry voltages which are below minimum operational limits. Similarly, during power up reset stabilization may not occur until reset circuit voltages exceed minimum operational levels.

During power down, an accurate reset assertion may be latched when power down is first detected to ensure an orderly shutdown. During power up, however, circuitry may not work in a predictable or reliable manner when the supply voltage is low, and reset assertion is problematic.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
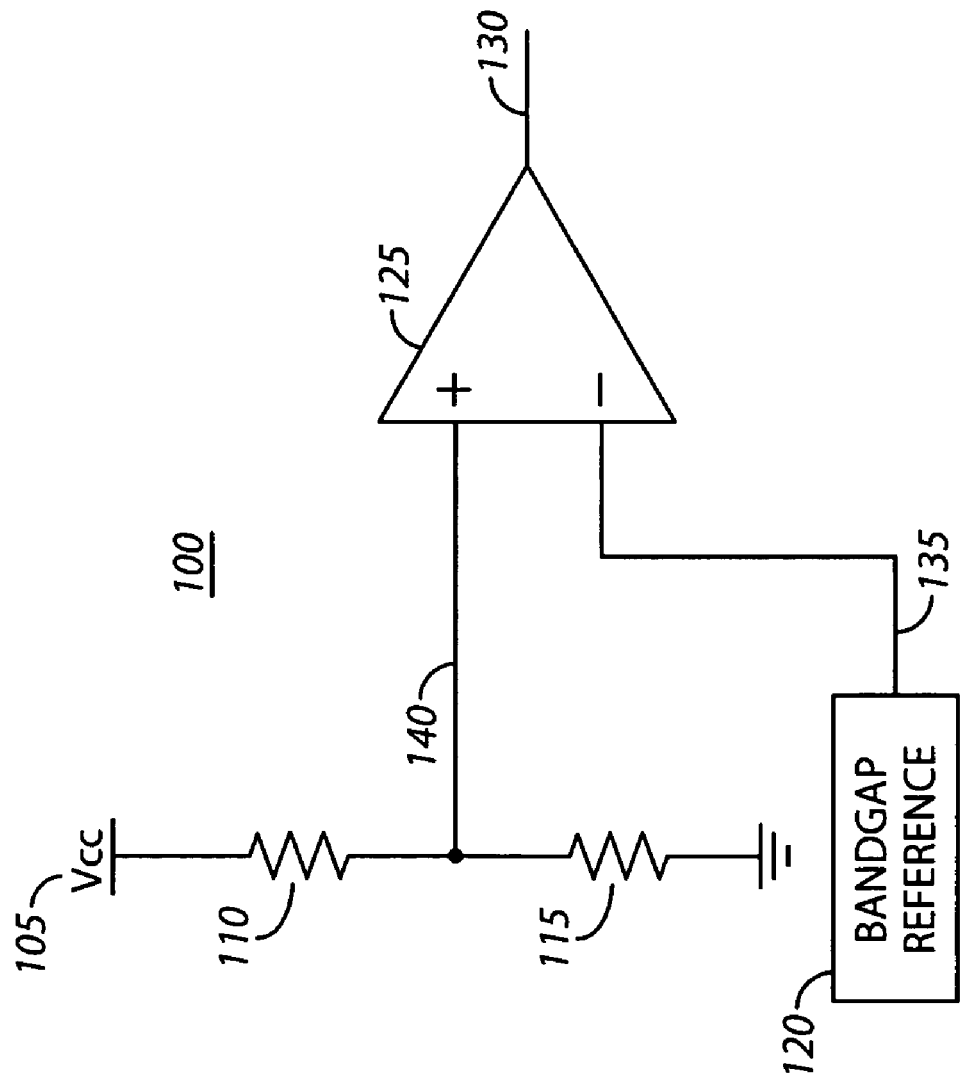
FIG. 1 is an exemplary simplified diagram of a reset system.

A structure for providing proper reset initialization during power up is presented, in accordance with certain embodiments of the present invention.

Many variations, equivalents and permutations of these illustrative exemplary embodiments of the invention will occur to those skilled in the art upon consideration of the description that follows. The particular examples should not be considered to define the scope of the invention. For example, discrete circuitry implementations and integrated circuit implementations, and hybrid approaches thereof, may be formulated using techniques of the present invention. Another example would be an implementation of the reset initialization functional elements across a system. A still further example would be using the reset initialization method of the present invention to provide proper power on reset to digital and analog circuitry.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

For purposes of this document, the exact mechanical and electrical parameters of components is not necessary to an understanding of the invention, and many different types of electrical and mechanical components may be utilized without departing from the spirit of the invention. An example is that components utilized in the circuit may differ as to value, power rating, and physical size. This document uses generalized descriptions by way of example only. Many variations for these constituent items are possible without departing from the spirit and scope of the invention.

Refer to FIG. 1, which is an exemplary simplified diagram of a reset system. Vcc 105 is the power supply, and is applied to elements of the circuit. Resistor 110 and resistor 115 form a voltage divider, such that the voltage of signal 140 is a constant less than 1.0 multiplied by the value of Vcc 105, thus being proportional to the value of Vcc 105. Bandgap reference 120 is used to develop a stable accurately known voltage at bandgap reference output 135, and a common value for this is 1.3 VDC. Comparator 125 compares signal 140 to bandgap reference output 135, and the output of comparator 125 is positive if signal 140 exceeds bandgap reference output 135, and zero or negative if bandgap reference output 135 exceeds signal 140. Signal 140 is greater that bandgap reference output 135 for normal operating conditions, and is less than bandgap reference output 135 when Vcc 105 is very low. It is normally arranged that signal 140 equals bandgap reference output 135 at that value of Vcc 105 which represents the minimum allowable operational voltage. Reset system output 130 is high for acceptable Vcc 105 levels, and low for Vcc 105 levels below the minimum allowable level. The polarity of system reset output 130 may be inverted if signal 140 and bandgap reference output 135 are reversed, wherein the polarity desired is a function of system design requirements.

During power down of Vcc 105, the operation of bandgap reference 120 and comparator 125 become uncertain since active circuits have minimum operational voltage supply levels below which proper operation is not guaranteed and operation may become erratic and unpredictable. It is fortunate that during power down the change of state of reset system output 130, which occurs at the preset minimum allowable threshold of Vcc, may be used to trigger a latch function (not shown) which can latch in the "Vcc 105 below specification" reset state. This circumvents further difficulties which might occur as Vcc 105 continues to decrease.

During power up of Vcc 105 the circuitry powered by Vcc 105 passes through low voltage conditions which are well below operational specifications for bandgap reference 120 and comparator 125. Because of this, the state of reset system output 130 is not predictable and thus not usable. This can result in false starts of downstream circuitry that relies on the reset system output 130 to indicate acceptable and unacceptable Vcc 105 minimum operational voltage.

Note that any reset system structure may be used to replace the example of FIG. 1. The basic requirement is that the reset system output one state if the supply voltage is acceptable and a different state if the supply voltage is unacceptable. It is not required that bandgap, divider, and comparator structures be separate or even identifiable as such because other overall structures exist which provide equivalent functionality. An example would be the use of a separately powered A/D converter followed by a comparison in software or firmware to determine if Vcc 105 is high or low. The threshold value chosen may be fixed, or may be variable as when the threshold value is a function of a parameter such as operating temperature or cumulative run time. Therefore, reset system 100 is in general any combination of component parts which provide an acceptable/unacceptable decision, regarding the status of Vcc 105 that controls the application of power to downstream circuitry.

Figure 2:
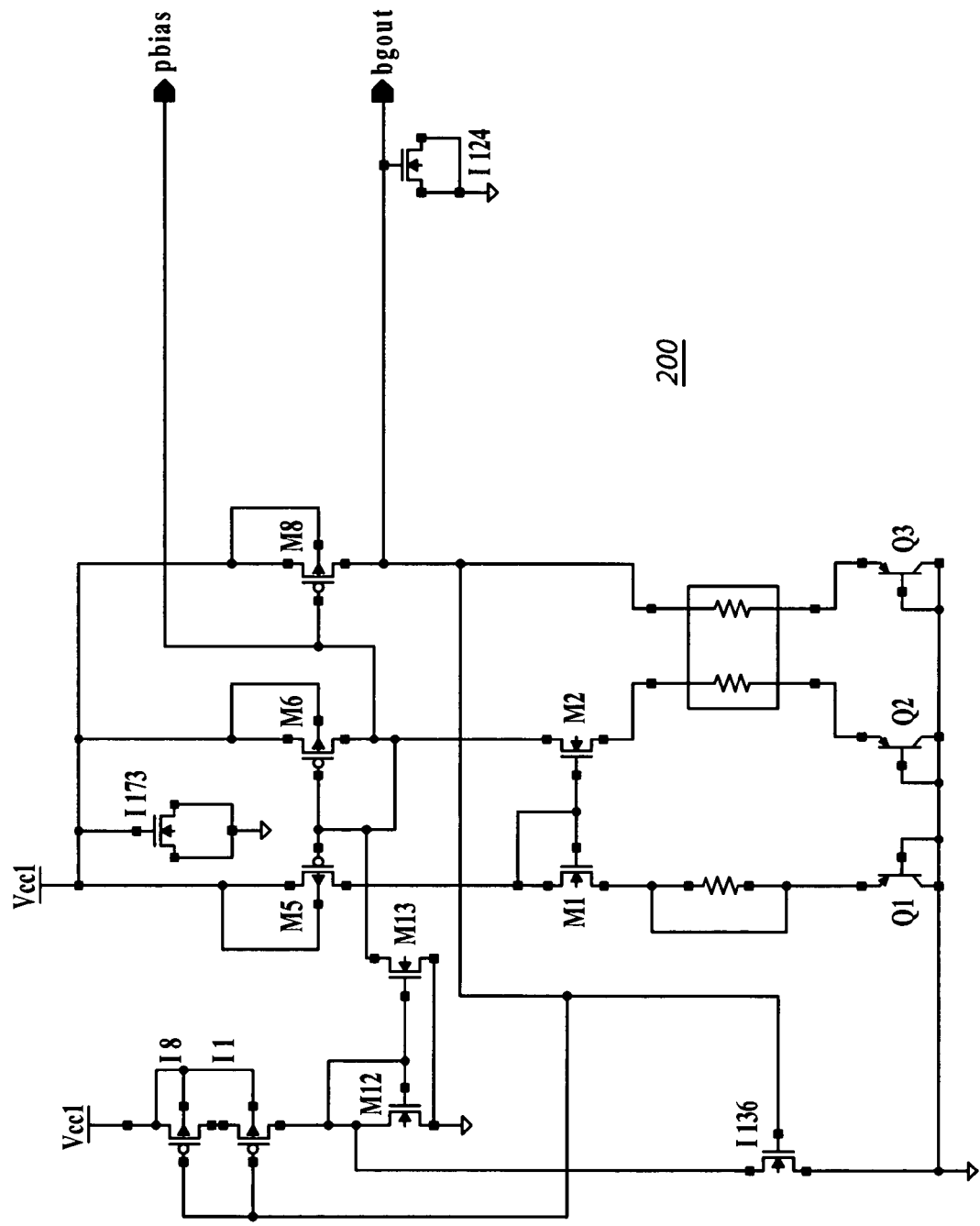
FIG. 2 is an exemplary simplified schematic diagram of a bandgap reference circuit, utilized in accordance with certain embodiments of the present invention.

Refer to FIG. 2, which is an exemplary simplified schematic diagram of a bandgap reference circuit, utilized in accordance with certain embodiments of the present invention. This circuit was utilized as part of an apparatus employed to test and validate the concepts and performance of the present invention. This bandgap reference produced a reference voltage of approximately 1.3 VDC to fulfill the function of bandgap reference 120 in reset system 100 of FIG. 1; other circuitry providing equivalent bandgap reference functionality may also be employed without departing from the spirit and scope of the invention. The specific circuit design will not be discussed here as it is not necessary to an understanding of the present invention.

Figure 3:
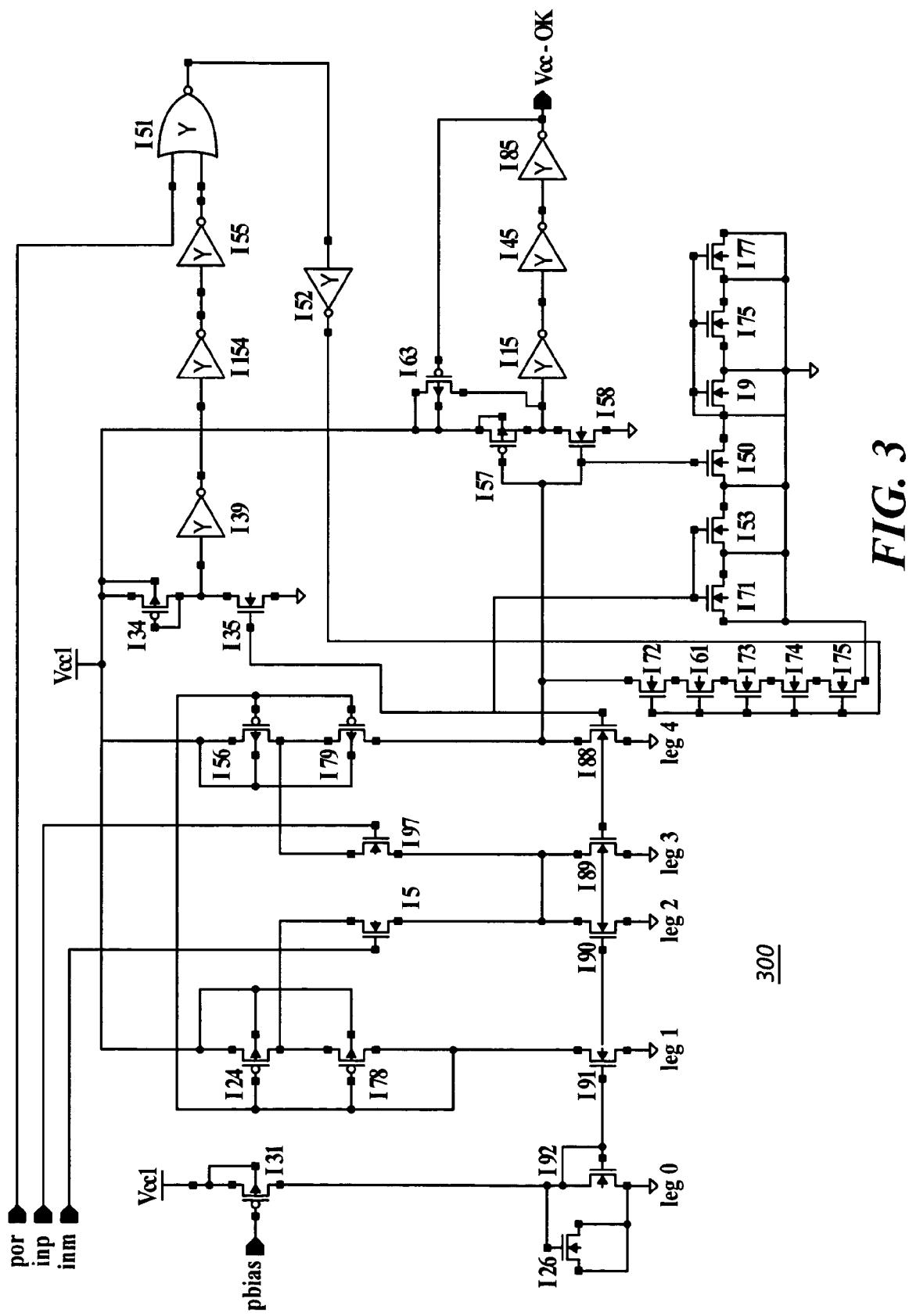
FIG. 3 is an exemplary simplified schematic diagram of a comparator circuit, utilized in accordance with certain embodiments of the present invention.

Refer to FIG. 3, which is an exemplary simplified schematic diagram of a comparator circuit, utilized in accordance with certain embodiments of the present invention. This circuit was utilized as part of an apparatus employed to test and validate the concepts and performance of the present invention. This comparator performs the comparator function of comparator 125 in reset system 100 of FIG. 1; other comparator circuitry providing equivalent comparator functionality may also be employed without departing from the spirit and scope of the invention. The specific circuit design will not be discussed here as it is not necessary to an understanding of the present invention.

Figure 4:
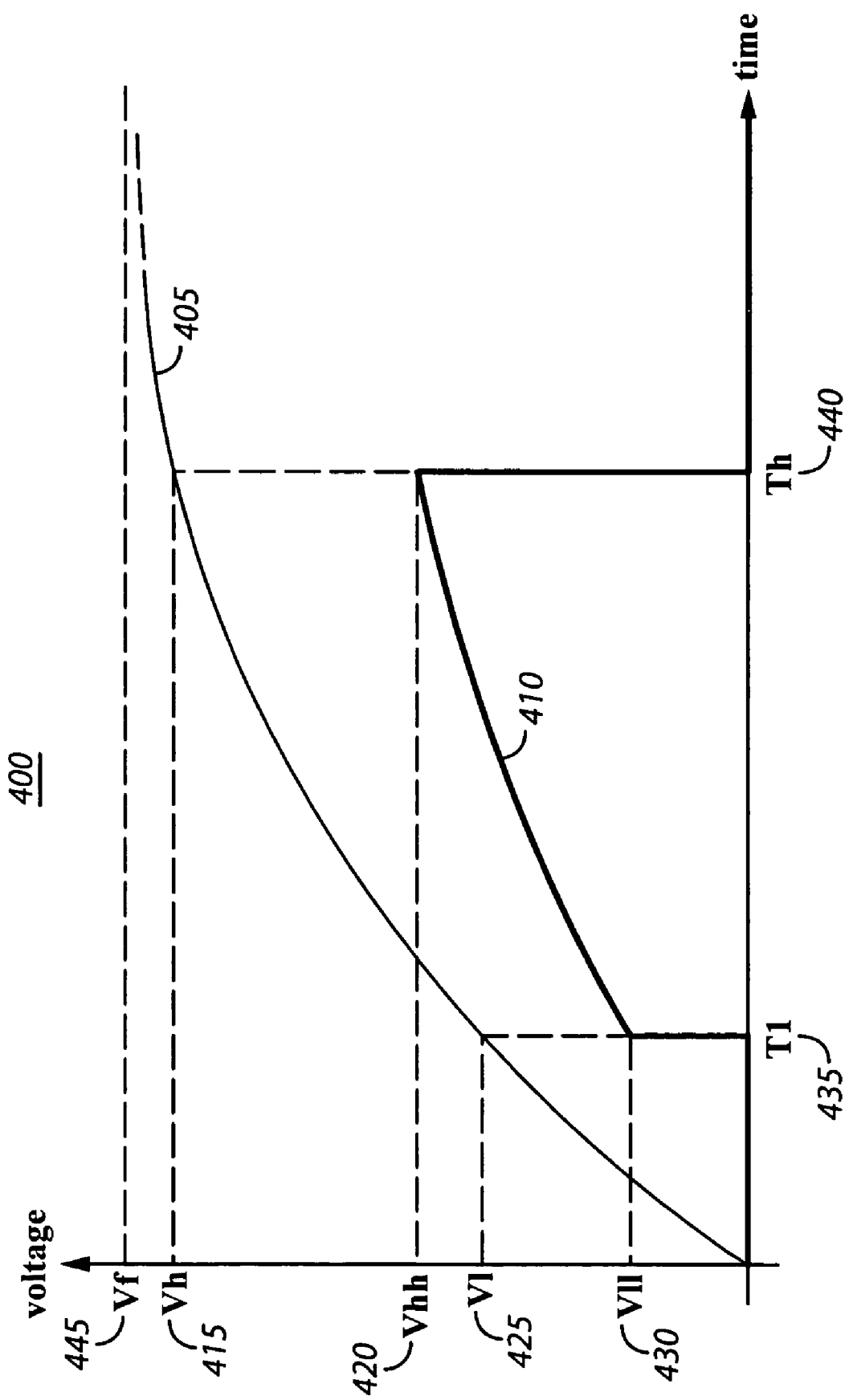
FIG. 4 is a simplified waveform diagram of a power on reset pulse, in accordance with certain embodiments of the present invention.

Refer to FIG. 4, which is a simplified waveform diagram of a power on reset pulse, in accordance with certain embodiments of the present invention. Power on reset pulse 410 is generated by a power on reset circuit, and an example of a power on reset circuit is presented below. Vcc 405 represents the supply voltage as it rises from zero at T=0 towards its final value Vf 445. It is important to note that a power on reset circuit and the resulting power on reset pulse 410 may be implemented for any supply voltage system requirement, wherein the following discussions of times and voltages of power on reset pulse 410 are to be interpreted appropriately for the existing application requirements.

As Vcc 405 rises during power up, it will pass through the voltage levels Vl 425 and Vh 415. When Vcc 405<Vl 425, power on reset pulse 410 is maintained low. When Vcc 405 equals Vl 425, power on reset pulse 410 is switched to a high state. This high state is maintained until Vcc 405 equals Vh 415, at which time power on reset pulse 410 is switched to a low state. Power on reset pulse 410 remains low for Vcc 405>Vh 415. Power on reset pulse 410 remains high for Vl 425<Vcc 405<Vh 415. In the example apparatus used to test and verify operation of the present invention, Vcc 405 was approximately 3 to 5 VDC, Vl 425 was approximately 0.7 VDC, and Vh 415 was approximately 1.7 VDC. Note that a power on reset circuit may be designed to accommodate any practical power on reset pulse 410 waveform. Note additionally that high and low states may be low and high states, respectively, as determined by the particular application and will not depart from the spirit and scope of the invention.

The power on reset pulse 410 is routed to other circuitry which will inhibit incorrect outputs of components such as reset system 100, bandgap reference 200, comparator 300, and similar or associated devices or circuitry which may provide false or unstable reset signals during power on low voltage conditions. Note that the values of Vll 430 and Vhh 420 are not relevant except insofar as they produce desired operation of associated circuitries.

As an example, consider bandgap and comparator components which may initiate erratic operation at a minimum of 1.1 VDC, and guaranteed bandgap and comparator component operation is not achieved until Vcc 405 exceeds 2.0 VDC. In this example a power on reset waveform 410 with Vl 425=0.7 VDC and Vh 415=2.5 VDC could be selected.

As a modification of the previous example, a narrower power on reset pulse 410 of Vl 425=0.7 VDC and Vh 415=1.7 VDC may be utilized in this example by incorporating a latch, which is controlled jointly by power reset pulse 410 and comparator output 130, such that latching occurs when power reset pulse 410 is high, and unlatching only occurs if comparator output 130 is 2.5 VDC or greater. This is discussed in more detail later.

During power down, power on reset pulse 410 operates in a similar but inverse manner (not shown) and functions as a "power down" reset pulse. When Vcc 405 drops to Vh 415, power on reset pulse 410 will go high. For Vh 415>Vcc 405>Vl 425 power on reset pulse 410 will remain high. When Vcc 405<Vl 425 power on reset pulse 410 is low. During the time power on reset pulse 410 is high, the effects of erratic operation of comparator output 130 are inhibited from affecting system operation as previously discussed for power up.

Note that although other techniques are available to control power down sequencing, the method of the present invention does not require additional circuitry, space, or cost.

Figure 5:
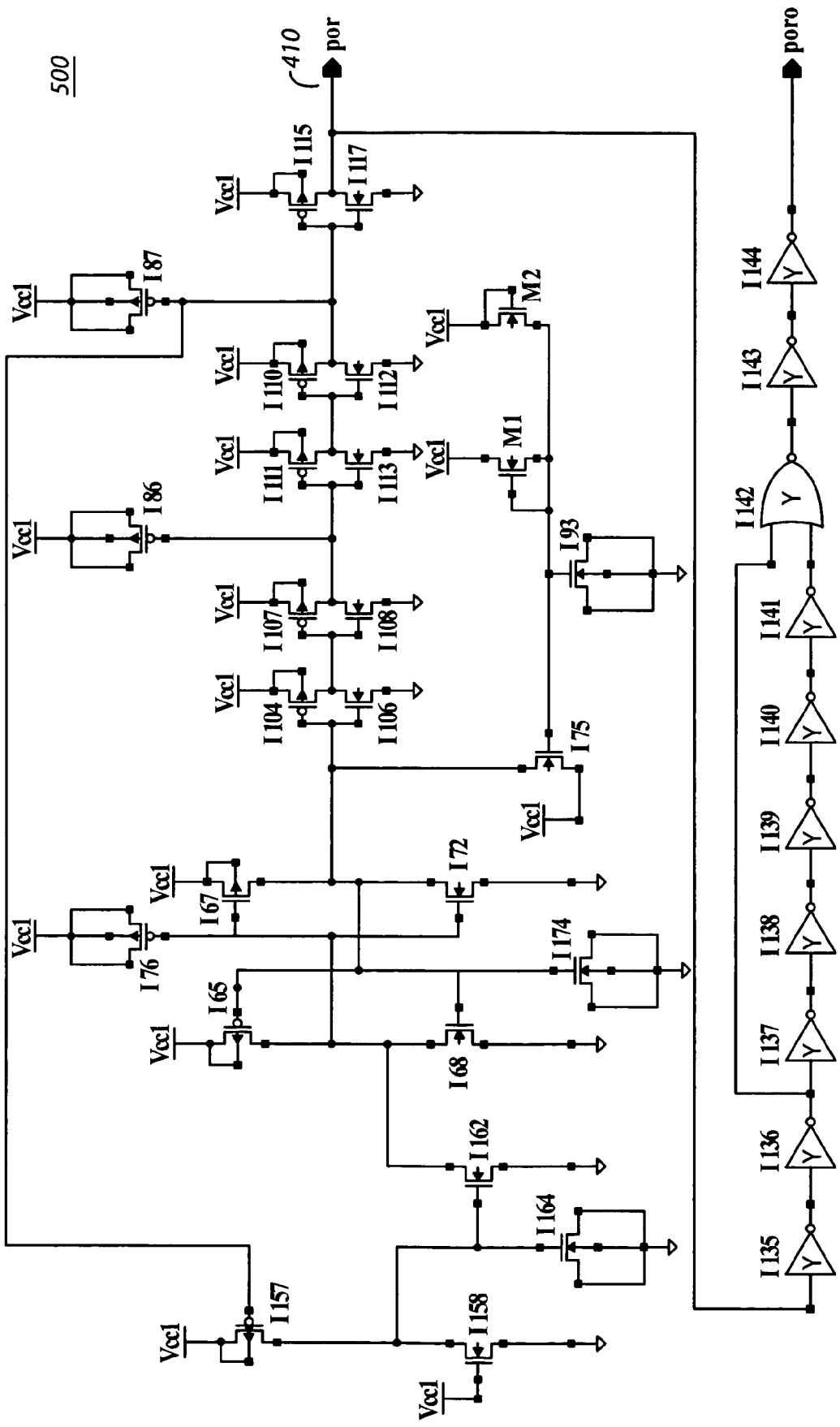
FIG. 5 is an exemplary simplified schematic diagram of a power on reset circuit, utilized in accordance with certain embodiments of the present invention.

Refer to FIG. 5, which is an exemplary simplified schematic diagram of a power on reset circuit, utilized in accordance with certain embodiments of the present invention. This circuit was utilized as part of an apparatus used to test and validate the concepts and performance of the present invention. This power on reset circuit produced reset pulse 410; other circuitry operable to produce reset pulse 410 may also be employed without departing from the spirit and scope of the invention. The specific circuit design will not be discussed here as it is not necessary to an understanding of the present invention.

Figure 6:
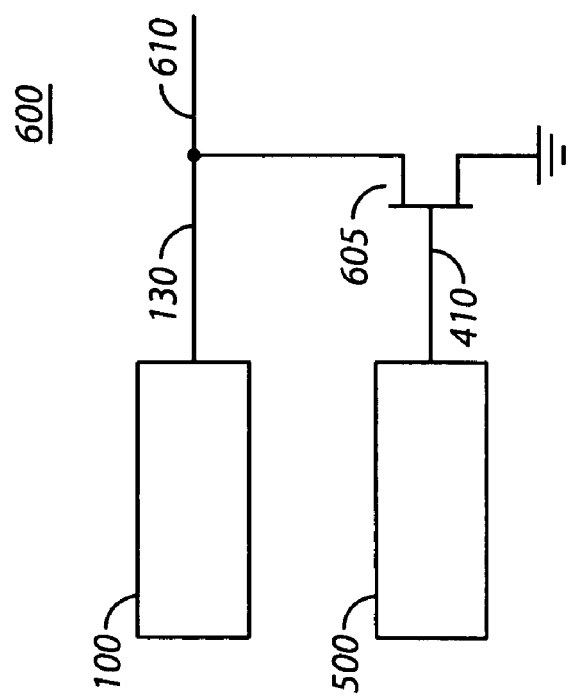
FIG. 6 is a simplified schematic diagram of a reset initialization circuit, in accordance with certain embodiments of the present invention.

Refer to FIG. 6, which is a simplified schematic diagram of a reset initialization system 600, in accordance with certain embodiments of the present invention. The reset system output 130 of reset system 100 is routed to transistor 605. Transistor 605 functions as a variable resistance between reset system output 130 and ground. When reset pulse 410 is low, transistor 605 is in a high resistance state and the value of reset system output 130 is unaffected. This is the non-reset condition. When reset pulse 410 is high, transistor 605 is in a low resistance state and reset system output 130 is effectively connected to ground. This is the reset condition. Output 610 is therefore zero (ground) when reset pulse 410 is high, and equal to reset system output 130 when reset pulse 410 is low. When output 610 is forced low by transistor 605, no reset irregularities generated in reset system 100 at low supply voltage levels will be present at output 610. When output 610 is not forced low by transistor 605 in the interval 0<Vcc 405<Vl 425, the output of reset system 100 is zero and stable—note that this is one of the operational characteristics of reset system 100 used to select Vl 425. When output 610 is not forced low by transistor 605 in the interval Vcc 405>Vh 415, the output of reset system 100 will be output 610. If the duration of reset pulse 410 is such that Vh 415 is greater than the minimum operational voltage specification of reset system 100, then the reset behavior of output 610, and circuitry it controls, is known for 0<Vcc 405<Vf 445. Operation during power down is similar but inverse to that during power up.

Figure 7:
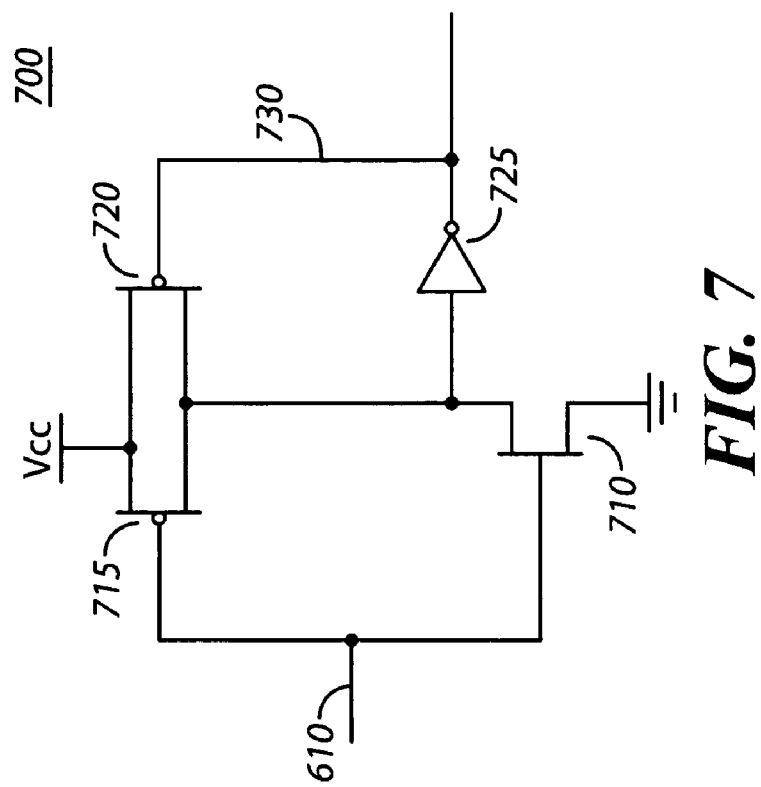
FIG. 7 is a simplified schematic diagram of a reset initialization circuit with latch, in accordance with certain embodiments of the present invention.

Refer to FIG. 7, which is a simplified schematic diagram of a reset initialization system 700 with latch capability, in accordance with certain embodiments of the present invention. If the width of reset pulse 410 is such that Vh 415 is not greater than the minimum operational voltage specification of reset system 100, then the reset characteristics of output 610 will be ambiguous in the range from Vh 415 to the minimum operational voltage requirements of reset system 100. This is resolved with a latch composed of transistors 715, 720, and 710, and inverter 725. Latch operation is controlled by output 610.

Output 610 is zero during the interval 0<Vcc 405<Vh 415, as previously discussed. When output 610 is zero, transistor 710 is open and transistor 715 is shorted. A high therefore appears at the input of inverter 725, and the output of inverter 725 is low. The low output of inverter 725 forces transistor 720 to a shorted condition. When output 610 is not zero, as for Vcc 405>Vh 415, the value of output 610 is equal to reset system output 130. The latch is designed so that a relatively high value of output 610 is required to produce the unlatched condition. The required value would be greater than the minimum operational voltage requirement of reset system 100, and the result is that an unlatched condition can only occur after reset system is operating properly. For example, if Vh=1.7 VDC, and the minimum operational voltage for reset system 100 is 2.0 VDC, then the latch will be designed with an unlatch input level in excess of 2.0 VDC. When the unlatch condition is met, transistor 710 will be shorted, the output of inverter 725 will be high, and transistor 720 and transistor 715 will be open. Note that the latch is equally responsive to both power up and power down conditions since the state of the latch is fully defined for 0<Vcc 405<Vf 445.

The latch described is an example of a latch implementation. This latch was utilized to test and verify aspects of the present invention. Latches may be designed in a variety of electronic forms, as is well understood in the art, without departing from the spirit and scope of the present invention.

Those of ordinary skill in the art will appreciate that many other circuit and system configurations can be readily devised to accomplish the desired end without departing from the spirit and scope of the present invention.

While the invention has been described in conjunction with specific embodiments, it is evident that many alternatives, modifications, permutations and variations will become apparent to those of ordinary skill in the art in light of the foregoing description. By way of example, other types of devices and circuits may be utilized for any component or circuit as long as they provide the requisite functionality. As another example, different values for the voltages Vl 425 and Vh 415 may be employed, depending on the design requirements of interest. A further example is that the described structure may be implemented as part of an integrated circuit, or a hybrid circuit, or a discrete circuit, or combinations thereof. Yet another example is that the features of the present invention may be adapted to all DC power systems regardless of voltages. Accordingly, it is intended that the present invention embrace all such alternatives, modifications and variations as fall within the scope of the appended claims.

What is claimed is:

1. A reset initialization structure, comprising:
   a system reset element, coupled to the voltage to be monitored;
   a power on reset element, which provides one state during an interval of the monitored voltage, wherein the system reset element operates independent of operation of the power on reset element; and
   a switching element, which is coupled to the power on reset element and the system reset element, which forces an output of the system reset element to a known value during the selected interval; and
   wherein during a power up condition the forced output of the system reset element is an unambiguous value during the selected interval and indicates that the value of the voltage to be monitored is below an operational minimum value for the system reset element.

2. The reset initialization structure of claim 1, wherein during a normal operational condition the output of the system reset element is not forced by the switching element, and indicates that the value of the voltage to be monitored is at or above the operational minimum value for the system reset element.

3. The reset initialization structure of claim 1, wherein during a power down condition the forced output of the system reset element is the unambiguous value during the selected interval and indicates that the value of the voltage to be monitored is below the operational minimum value for the system reset element.

4. The reset initialization structure of claim 1, wherein the selected interval is set by modifying limits in the power on reset element.

5. A reset initialization structure, comprising:
   a system reset element, coupled to the voltage to be monitored;
   a power on reset element, which provides one state during an interval of the monitored voltage, wherein the system reset element operates independent of operation of the power on reset element;
   a switching element, which is coupled to the power on reset element and the system reset element, which forces an output of the system reset element to a known value during the selected interval; and a latching element, which is coupled to the reset element and the switching element, which is responsive to the output of the system reset element;

wherein during a power up condition the forced output of the system reset element is an unambiguous value during the selected interval and indicates that the value of the voltage to be monitored is below an operational minimum value for the system reset element, and that the first unambiguous value will cause the latch output to latch, and wherein following the end of the selected interval the latch output will remain latched until the output of the system reset element is at or above an operational minimum value for the system reset element.

6. The reset initialization structure of claim 5, wherein during a normal operational condition the output of the system reset element remains at or above the operational minimum value for the system reset element and the latching element will remain unlatched.

7. The reset initialization structure of claim 5, wherein during a power down condition the output of the system reset element will decrease below the operational minimum value for the system reset element which will cause the latching element to latch.

8. The reset initialization structure of claim 5, wherein the selected interval is set by modifying limits in the power on reset element.

9. The reset initialization structure of claim 5, wherein the value of the system reset element output at which the latching element will unlatch may be modified by changing limits within the latching element.

10. A reset initialization apparatus, operable to supply a nonambiguous control of a system reset during power on and power off conditions, comprising:

means to force an output of the system reset to a known state during a selected interval of a monitored voltage, wherein the output of the system reset is generated by a power on reset circuit in cooperation with a system reset element comprising a bandgap reference;

means to latch the output of the system reset upon occurrence of the selected interval or upon occurrence of a voltage that is less than the operational minimum for the system reset;

means to unlatch the output of system reset when the voltage is at or above the operational minimum for the system reset; and means to modify the selected interval.

11. A reset initialization method to provide control of the system reset, comprising:

selecting a first voltage level that will initiate a selected interval during a power up condition, wherein the first voltage is less than a first supply voltage at which system reset may become ambiguous, wherein the system reset is generated by a power on reset circuit in cooperation with a system reset element comprising a bandgap reference and wherein initiation of the selected interval will set a latch to a reset value;

selecting a second voltage that will terminate the selected interval during the power up condition, wherein the second voltage is greater than the first voltage; and selecting a third voltage that will set the latch to a non-reset value when the third voltage is equaled or exceeded, wherein the third voltage is greater than the second voltage and wherein the third voltage is greater than a second supply voltage below which the system reset may become produce ambiguous outputs.

* * * * *